United States Patent
Merritt et al.

(10) Patent No.: US 6,529,426 B1
(45) Date of Patent: Mar. 4, 2003

(54) CIRCUIT AND METHOD FOR VARYING A PERIOD OF AN INTERNAL CONTROL SIGNAL DURING A TEST MODE

(75) Inventors: Todd A. Merritt, Boise, ID (US); Paul S. Zagar, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 08/816,943

(22) Filed: Jan. 28, 1997

Related U.S. Application Data

(63) Continuation of application No. 08/196,619, filed on Feb. 14, 1994.

(51) Int. Cl.⁷ ................................................. G11C 7/00
(52) U.S. Cl. ........................ 365/201; 365/222; 365/236; 365/233; 365/189.09
(58) Field of Search ...................... 365/201, 189.01, 365/233, 230.01, 230.06; 324/731, 763, 765

(56) References Cited

U.S. PATENT DOCUMENTS

| | | | |
|---|---|---|---|
| 3,781,683 A | 12/1973 | Freed | 324/158 F |
| 3,803,483 A | 4/1974 | McMahon, Jr. | 324/158 F |
| 3,832,535 A | 8/1974 | De Vito | 235/153 AC |
| 3,849,872 A | 11/1974 | Hubacher | 324/158 T |
| 4,079,338 A | 3/1978 | Kronlage | 331/57 |
| 4,099,722 A | 7/1978 | Rodesch et al. | 273/143 R |
| 4,139,848 A | 2/1979 | Schneider | 324/73 R |
| 4,365,481 A | 12/1982 | Pearlstein et al. | 62/123 |
| 4,434,328 A | 2/1984 | Fields | 361/155 |
| 4,575,825 A | 3/1986 | Otaki et al. | 365/189 |
| 4,594,711 A | 6/1986 | Thatte | 371/25 |
| 4,597,617 A | 7/1986 | Enochs | 439/66 |
| 4,635,261 A | 1/1987 | Anderson et al. | 371/25 |
| 4,677,586 A | 6/1987 | Magar et al. | 364/900 |
| 4,771,407 A | 9/1988 | Takemae et al. | 371/21.1 |
| 4,783,719 A | 11/1988 | Jamison et al. | 324/537 |

(List continued on next page.)

FOREIGN PATENT DOCUMENTS

| | | | |
|---|---|---|---|
| EP | 0494782 | 9/1992 | |
| JP | 55-20555 | * 2/1980 | |
| JP | 0181548 | 10/1984 | 437/8 |
| JP | 61-274335 | * 12/1986 | |
| JP | 61-274355 | 12/1986 | H01L/27/10 |
| JP | 0139039 | 2/1989 | H01L/21/82 |
| JP | 1192099 | 8/1989 | |
| JP | 0227081 | 9/1989 | 324/73.1 |
| JP | 4042229499 | * 8/1992 | |
| JP | 4264277 | 9/1992 | |
| JP | 404286800 A | * 10/1992 | |
| JP | 405282858 | * 10/1993 | |
| JP | 0612878 | 1/1994 | G01K/31/318 |
| JP | 406103760 A | * 4/1994 | |
| JP | 406302198 | * 10/1994 | |

OTHER PUBLICATIONS

Merritt, Todd.,et al. , "Circuit and Method for Varying a Pulse Width of an Internal Control Signal During a Test Mode", U.S. Application No. 08/603,943, filed Feb. 20, 1996,.

Protopapas, D..A. , "Microcomputer Hardware Design", (1988), 181–188.

*Primary Examiner*—Viet Q. Nguyen
(74) *Attorney, Agent, or Firm*—Schwegman, Lundberg, Woessner & Kluth, P.A.

(57) ABSTRACT

The invention is a dynamic random access memory (DRAM) device having an electronic test key fabricated on board and is a method for testing the DRAM. The electronic test key generates a signal which effects a variation in a period of an internal control signal to stress the DRAM during a test mode.

21 Claims, 5 Drawing Sheets

U.S. PATENT DOCUMENTS

| | | | |
|---|---|---|---|
| 4,890,270 A | 12/1989 | Griffith | 368/113 |
| 4,894,805 A | 1/1990 | Godslialk et al. | 365/222 |
| 4,899,107 A | 2/1990 | Corbett et al. | 324/765 |
| 4,907,117 A | 3/1990 | Pease et al. | 361/54 |
| 4,954,878 A | 9/1990 | Fox et al. | 439/66 |
| 4,956,602 A | 9/1990 | Pasrrish | 324/158 R |
| 4,961,053 A | 10/1990 | Krug | 324/158 R |
| 4,968,931 A | 11/1990 | Littlebury et al. | 324/760 |
| 4,987,365 A | 1/1991 | Shreeve et al. | 324/758 |
| 5,012,180 A | 4/1991 | Dalrymple et al. | 324/73.1 |
| 5,023,840 A | 6/1991 | Tobita | 365/201 |
| 5,047,711 A | 9/1991 | Smith et al. | 324/158 R |
| 5,059,899 A | 10/1991 | Farnworth et al. | 324/13.1 |
| 5,065,091 A | 11/1991 | Tobita | 324/158 R |
| 5,073,874 A | 12/1991 | Yamada et al. | 365/226 |
| 5,083,299 A | 1/1992 | Schwanke et al. | 368/113 |
| 5,099,196 A | 3/1992 | Longwell et al. | 324/158 R |
| 5,109,320 A | 4/1992 | Bourdelaise et al. | 361/785 |
| 5,111,433 A * | 5/1992 | Miyamoto | 365/201 |
| 5,142,224 A | 8/1992 | Smith et al. | 324/158 R |
| 5,153,509 A | 10/1992 | Dalrymple et al. | 371/15.1 |
| 5,155,704 A | 10/1992 | Walther et al. | 365/201 |
| 5,204,837 A | 4/1993 | Suwa et al. | 365/201 |
| 5,208,777 A | 5/1993 | Shibata | 365/201 |
| 5,210,856 A | 5/1993 | Auvinen et al. | 713/400 |
| 5,251,174 A | 10/1993 | Huang | 365/200 |
| 5,257,233 A | 10/1993 | Schaefer | 365/227 |
| 5,274,591 A | 12/1993 | Waller et al. | 365/189.5 |
| 5,276,647 A | 1/1994 | Matsui et al. | 371/21.1 |
| 5,295,110 A | 3/1994 | Sakakibara | 365/222 |
| 5,307,010 A | 4/1994 | Chiu et al. | 324/766 |
| 5,321,661 A | 6/1994 | Iwakiri et al. | 365/222 |
| 5,355,342 A | 10/1994 | Ueoka | 365/201 |
| 5,365,481 A | 11/1994 | Sawada | 365/201 |
| 5,384,741 A | 1/1995 | Haraguchi et al. | 365/201 |
| 5,400,289 A | 3/1995 | Blodgett | 355/222 |
| 5,428,575 A | 6/1995 | Fudeyasu | 365/201 |
| 5,457,400 A | 10/1995 | Ahmad et al. | 324/763 |
| 5,483,175 A | 1/1996 | Ahmad et al. | 324/766 |
| 5,619,463 A * | 4/1997 | Malhi | 365/201 |
| 5,627,478 A * | 5/1997 | Habersetzer et al. | 324/763 |
| 5,708,802 A * | 1/1998 | Monshima et al. | 395/559 |
| 5,831,918 A | 11/1998 | Merritt et al. | 365/201 |
| 5,845,059 A * | 12/1998 | McClure | 395/183.03 |
| 5,991,214 A | 11/1999 | Merritt et al. | 365/201 |
| 6,118,711 A * | 9/2000 | Meritt | 365/200 |
| 6,160,413 A * | 12/2000 | Habersetzer et al. | 324/763 |
| 6,255,838 B1 * | 7/2001 | Haberseter et al. | 324/763 |
| 2001/0015654 A1 * | 8/2001 | Habersetzer et al. | 324/763 |

\* cited by examiner

CIRCUIT AND METHOD FOR VARYING A PERIOD OF AN INTERNAL CONTROL SIGNAL DURING A TEST MODE

This application is a continuation of application Ser. No. 08/196,619, filed Feb. 14, 1994.

CROSS REFERENCE TO RELATED APPLICATIONS

This application is being filed simultaneously with and contains similar material to copending application having disclosure number 93-377.1 entitled A CIRCUIT AND METHOD FOR VARYING A PULSE WIDTH OF AN INTERNAL CONTROL SIGNAL DURING A TEST MODE.

This application may also contain similar material to copending U.S. patent application, Ser. No. 08/121,813, entitled "A CIRCUIT AND METHOD FOR DISABLING A LOCKOUT FUNCTION," and to copending U.S. patent application Ser. No. 08/096,643, entitled "SEMICONDUCTOR ARRAY HAVING BUILT-IN TEST CIRCUITRY FOR WAFER LEVEL TESTING."

FIELD OF THE INVENTION

The invention relates to the testing of electrical devices, and more particularly to an internal test key and internal circuitry for testing an encapsulated DRAM.

BACKGROUND OF THE INVENTION

A dynamic random access memory (DRAM) consists of an arrangement of individual memory cells. Each memory cell comprises a capacitor capable of holding a charge and a field effect transistor, hereinafter referred to as an access transistor, for accessing the capacitor charge. The charge is referred to as a data bit and can be either a high voltage or a low voltage. Therefore, the memory has two states; often thought of as the true logic state and the complementary logic state. An arrangement of memory cells is called an array. There are two options available in a DRAM memory: a bit of data may be stored in a specific cell in the write mode, or a bit of data may be retrieved from a specific cell in the read mode. The data is transmitted on signal lines, also called digit lines, to and from the Input/Output lines, hereinafter known as I/O lines, through field effect transistors used as switching devices and called decode transistors. For each bit of data stored, its true logic state is available at the I/O lines and its complementary logic state is available at lines designated I/O*. Each cell has two digit lines referred to as digit line pairs.

In order to read from or write to a cell, the particular cell in question must be selected, also called addressed. Typically, the cells are arranged in the array in a configuration of intersecting rows and columns. In previous generations of DRAMs to select a cell an active output from a row decoder selects a wordline appropriate to the given address in response to an active external row address strobe (RAS) signal. In most applications the active RAS signal is low. The active wordline then turns on the cell's access transistor. Next the column decoder activates and selects the desired digit line pair in response to a column address strobe (CAS) signal. For a write operation the active column decoder output activates the decode transistors to pass the data to be written from the I/O lines to the digit line pair. The data is coupled through the access transistor to the memory cells which store the data.

More recent generations of DRAMS have lockout circuits on board that "catch" pulses that are too short and lock out the premature transitions of external signals to the DRAM. For example if the tRAS functional specification, the minimum time that RAS must be active for the DRAM to function normally, is violated the lockout circuit will ignore a transition of the external RAS signal to the inactive state until the DRAM has had time to sense and restore the memory properly. Thus the lockout circuit generates an internal RAS signal having a greater pulse width than the pulse width of the corresponding external RAS signal when the external RAS signal doesn't meet the tRAS functional specification. A similar circuit exists for tRP, the minimum time that RAS must be inactive during precharge. In both cases lockout circuits have made testing of the DRAM more difficult.

The tRAS functional specification as defined above and the tRAS specification typically defined in the DRAM data book should not be confused. In order to meet the data book tRAS specification the DRAM must function normally if the external RAS signal is active for a length of time equal to or greater than the data book tRAS specification.

Before the internal lockout circuits were incorporated into the DRAM circuit the pulse width of the external control signal could be decreased or increased, as the case may be, to stress the DRAM while testing the device. With the advent of internal lockout circuits this is no longer possible since the lockout circuit automatically decreases or increases the pulse width of the external control signal when it fails to meet the functional specification. Thus testing becomes more difficult, especially on encapsulated DRAMs. Instead of failing for a simple test, such as would be the case where the pulse width of an external control signal can be varied, the part fails more complicated tests later in the test flow process.

There exists a need to be able to test, with better guardband, DRAMs having lockout circuitry. The guardband is a region in which the part is capable of operating which lies outside of a region defined by the specifications of the part.

For DRAMS having self-refresh, the internal refresh rate is variable due to process variation, temperature effects, voltage levels, and in some cases elective trimming to attain a particular refresh rate or standby current level. Since the refresh is done internally, it can be estimated but not measured. This makes it impossible to detect whether the part is right on the edge of failing or not.

In order to ensure that you have guardband for the self-refresh mode, there exits a need to find a way to increase the period of the refresh cycle during a test mode. Parts which pass tests when the period of the refresh cycle is increased are not on the edge of failing.

SUMMARY OF THE INVENTION

The invention is a monolithic chip having a timing circuit, a memory circuit, and an electronic test key fabricated on board and is the method of testing the monolithic chip. The timing circuit generates a control signal in response a timing signal. The electronic test key responds to a test signal and generates a mode signal to control a value of a period of the control signal during normal operation and during a test mode. A memory circuit responds to the control signal.

Typically, the electronic test key responds to at least one external test signal to control a circuit test on the part. The electronic test key generates a signal which varies a frequency of an oscillator in the timing circuit in order to stress the part during test. The invention is particularly useful in DRAM technologies.

In one embodiment, the invention is a self-refresh DRAM device having an electronic test key and having a self-refresh cycle. The period of the refresh cycle is increased by the circuitry and method of the invention. The refresh period is determined by an oscillator and a counter. During testing the electronic test key on the DRAM generates a signal which controls the oscillator circuit to decrease the frequency of the oscillator output signal, this decrease, in turn, increases the period of the self-refresh cycle. The DRAM is then stressed during self-refresh since it is required to hold the valid charge for a longer period of time during testing. Thus, if the DRAM passes the tests performed for self-refresh when the period of the self-refresh cycle is increased beyond the period of the normal self-refresh cycle, the circuit has good guardband and margin.

Thus by using the circuit and method of the invention it is no longer necessary to guess what the internal refresh rate is. If the part passes the test mode it automatically has added margin. The percentage of added margin can be closely controlled and no longer relies on taking into account all variables, such as temperature, transistor characteristics, and defects. Test programs in the back end can be simplified because they don't have to cover a range of values or bin out parts to different self-refresh values. In fact the part must only be tested for current draw and functionality in self-refresh.

DETAILED DESCRIPTION OF THE INVENTION

Figure 1A:
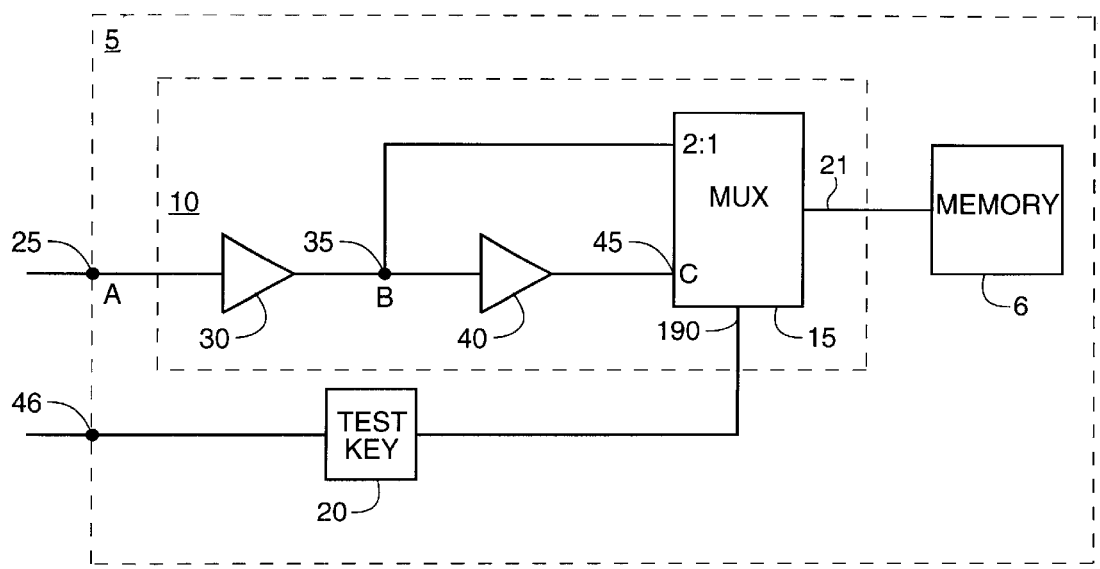
FIG. 1A is a schematic of a lockout circuit and test key of a first embodiment of the invention.
Figure 2A:
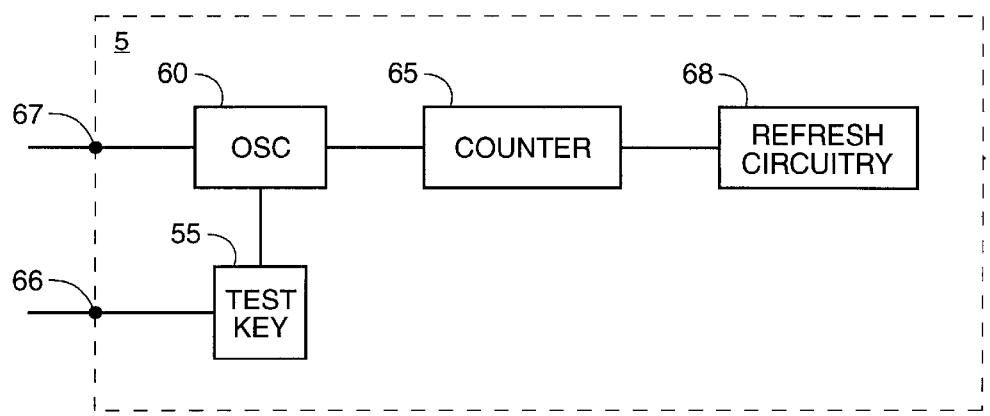
FIG. 2A is a block schematic of an oscillator, counter, and test key of a second embodiment of the invention.

FIGS. 1A and 2A are block schematics depicting the elements of two embodiments of the invention. The invention is an monolithic dynamic random access memory (DRAM) device 5. The DRAM 5 is fabricated on a supporting substrate and is typically encapsulated. The DRAM 5 stores data in memory cells (not shown) arranged in a matrix of intersecting rows and columns in a memory circuit 6. External signals on external address input pins (not shown) address the DRAM and determine which memory cell is selected for a read or write operation. One combination of external address signals specifies the row on which a selected memory cell is located and one combination of address signals specifies the column on which the selected cell is located. The memory device is responsive to an external row address strobe (RAS) signal for strobing in the row location and is responsive to a column address strobe (CAS) signal for strobing in a column location.

The DRAM 5 of FIG. 1A comprises a lockout circuit 10 having a multiplexer 15 and comprises an electronic test key 20. The lockout circuit 10 generates an internal RAS control signal at multiplexer output 21 in response to the external RAS control signal at input node 25. The internal RAS control signal controls at least one circuit function of memory circuit 6. A positive going transition of the external RAS signal at input node 25(A) experiences a delay in first delay circuit 30 such that an active pulse at node 35(B) has a greater pulse width than the pulse width of the corresponding active pulse of the external RAS signal at node 25. The positive going transition of the signal at node 35 experiences a delay in a second delay circuit 40 such that the active pulse at node 45(C) has a greater pulse width than the pulse width of the active pulse at node 35. The test key circuit 20 responds to a combination of external test signals on at least one input node 46 to generate a mode signal to control the output signal of multiplexer 15. During normal operation of the DRAM the signal at node 45 is selected by the mode signal of test key circuit 20 and multiplexed to the output node 21 of multiplexer circuit 15. During a test mode the signal at node 35 is multiplexed to output node 20 in response to the mode signal of test key circuit 20. The signal at node 21 is the internal RAS control signal.

Figure 1B:
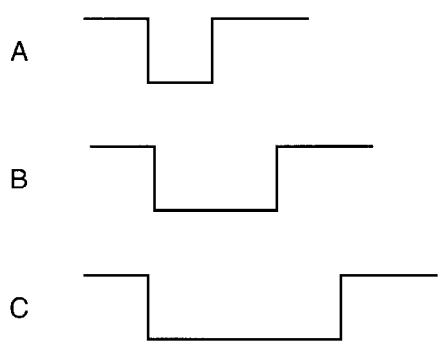
FIG. 1B compares relative pulse widths of signals at nodes A, B, and C of FIG. 1.

FIG. 1B compares the relative pulse widths of the active pulses at nodes 25, 35, and 45. It can be seen that the pulse width of the active pulse at node 45(C), which is multiplexed to output node 21 during normal operation, is greater than the pulse width of the active pulse at node 35(B) which, is multiplexed to output node 21 during the test mode. Circuit tests are conducted when the pulse width of the active pulse of the internal RAS control signal, B, is less than would normally be expected, C, for the part. This stresses the part during test and ensures that the part has good guardband.

The DRAM 5 of FIG. 2A comprises a test key circuit 55, an oscillator circuit 60, and a counter 65. The test key circuit 55 responds to at least one external signal at node 66 to generate a mode signal to control the oscillator during normal operation and during a test mode. The oscillator circuit 60 responds to a self-refresh signal by oscillating. The self-refresh signal may be generated internally in response to at least one external signal at node 67. During normal operation the oscillator is designed to generate an alternating signal having a frequency within a desired range. The counter is designed to pulse after a desired number of oscillations thereby generating a square wave having a lower frequency than the oscillator frequency. The counter output signal activates refresh circuitry 68 and determines the refresh period which is equal to the cycle time or period of the counter output signal times the number of rows being refreshed. The refresh circuitry restores memory cell voltages to their originally stored levels.

During the test mode the test key 55 generates an active signal which decreases the frequency of the oscillator signal thereby increasing the refresh period.

Figure 2B:
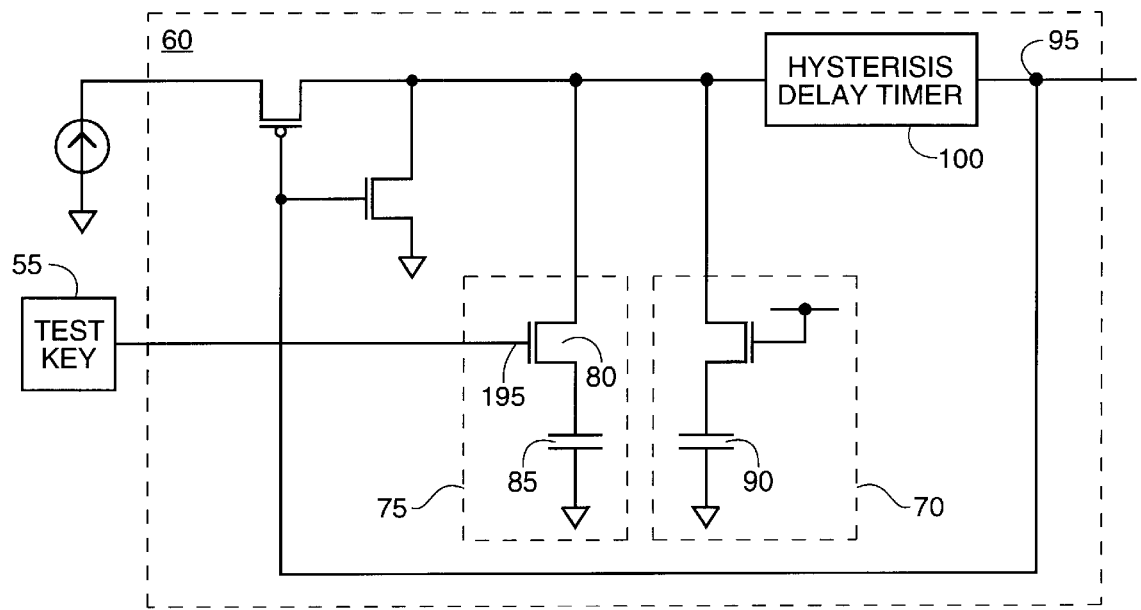
FIG. 2B is a more detailed schematic of the oscillator of FIG. 2A.

FIG. 2B is a simplified schematic of a portion of the oscillator circuit 60 of the invention. The oscillator comprises a primary oscillator circuit 70 and a secondary oscillator circuit 75. During normal operation only the primary oscillator circuit generates an alternating signal. During normal operation the test key circuit 55 generates an output signal which deactivates switch 80 and isolates capacitor 85 from the primary oscillator circuit 70. During the test mode the mode signal of test key circuit 55 activates switching device 80 thereby coupling capacitor 85 in parallel with capacitor 90. The total capacitance increases during the test mode and is the total capacitance of capacitors 85 and 90.

Since discharge is slower for a greater capacitance, the frequency of the oscillator output signal at the output node 95 of the hysteresis delay timer circuit 100 is less during the test mode than during normal operation. Since the frequency is less the period of the oscillator output signal and the period of counter output signal is greater. Thus the self-refresh period is greater. The percentage increase in the self-refresh period is equal to the percentage increase in the total capacitance of the oscillator circuit during the test mode and is therefore easily controlled.

Figure 2C:
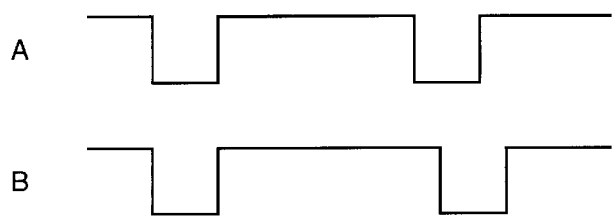
FIG. 2C compares the period of a refresh signal during normal operation and during a test mode.

FIG. 2C compares the period of the refresh signal during normal operation, represented by square wave A, and the period of the refresh signal during the test mode, represented by square wave B. The frequency of the oscillator decreases during the test mode increasing the period of the refresh signal. Increasing the period of the refresh signal increases the pulse width of at least one of the pulses of the refresh signal, in this example the more positive pulse.

Figure 3:
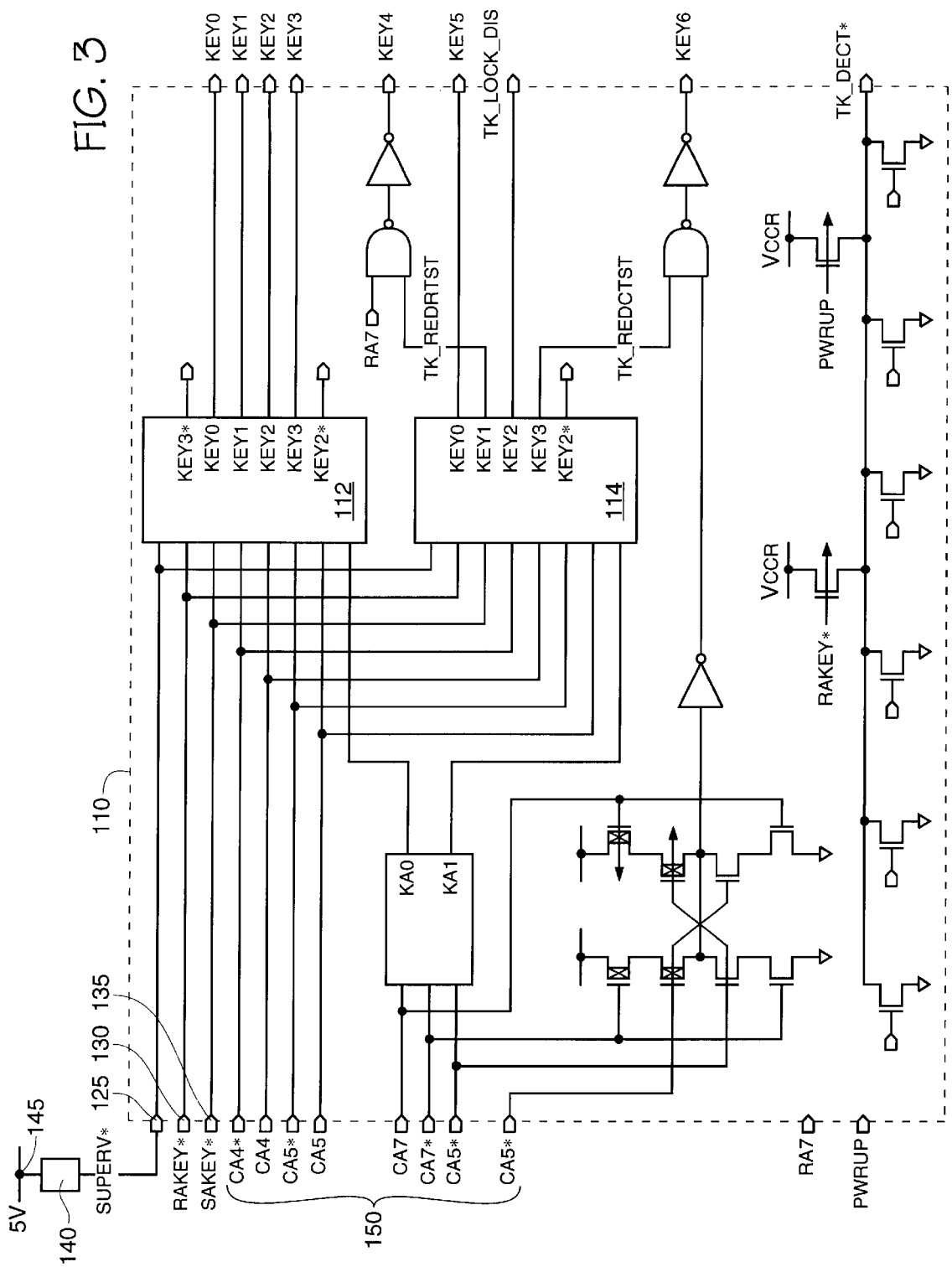
FIG. 3 is a more detailed schematic of a test key circuit shown in FIGS. 1A or 2A.

FIG. 3 is an electronic test key circuit 20 or 55 of FIGS. 1A and 2A respectively. In FIG. 3 the electronic test key will be referred to as primary test key 110. The primary test key 110 comprises test key subcircuits. Each subcircuit generates signals to control various test functions. There are two blocks 112 and 114, each of which comprises a plurality of subcircuits. It can be seen that the primary test key 110 is responsive to potentials at various input nodes. In particular the primary test key 110 is responsive to a super voltage logic signal at input node 125, a reset test key (RAKEY*) signal at input node 130, and a set test key (SAKEY*) signal at input node 135. The SAKEY* signal is generated in response to a write enable (WE) before CAS before RAS (WCBR) cycle, which means that WE and CAS are low when RAS goes low. The super voltage logic signal is generated in a super voltage logic circuit 140 in response to the potential of a super voltage at node 145. Signals on Address inputs 150 function as codes to determine which test key subcircuits are activated during the testing process. During the test mode the address input signals typically are varied as the DRAM is tested.

The super voltage is a voltage typically 4 volts greater than a supply potential applied to the DRAM during normal operation. For example, a DRAM having a 5 volt supply potential typically has a 9 volt super voltage. Logic signals are generated in response to the super voltage to control the testing of the DRAM. By utilizing a potential significantly larger than the supply potential as the super voltage the DRAM does not accidently go into a test mode during normal operation.

Figure 4:
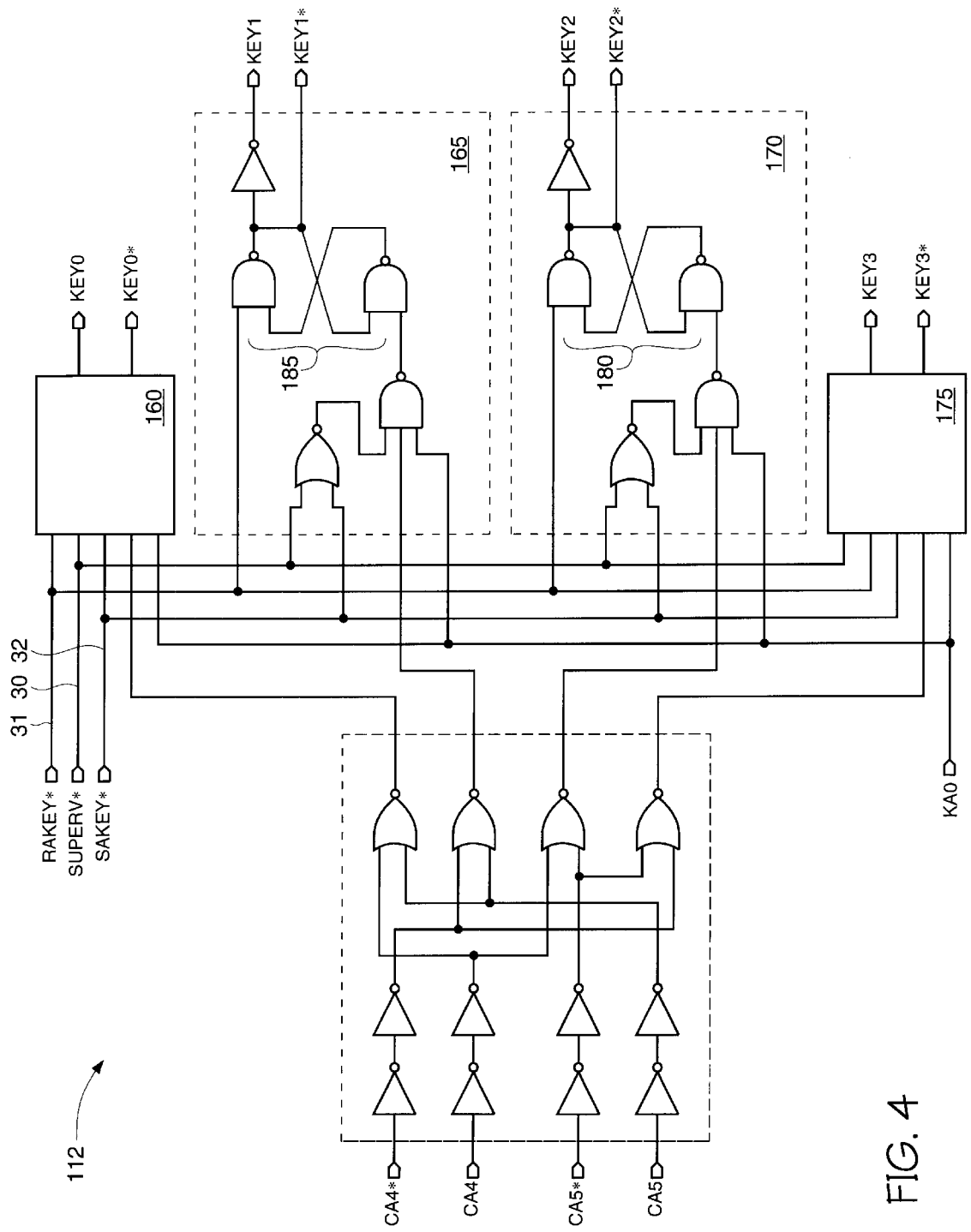
FIG. 4 is a more detailed schematic of a portion of the test key circuit of FIG. 3.

FIG. 4 is the schematic representation of block 112 of FIG. 3 and is selected in response to potentials on CA7, CA7*, and CA5*. Block 112 is responsive to address input signals on address input pins CA4, CA4*, CA5, and CA5*, test key enable signals RAKEY* and SAKEY*, and the super voltage logic signal. In block 112 there are four test key subcircuits 160, 165, 170 and 175. In the first embodiment the test key subcircuit 170 generates a signal to control the multiplexer of FIG. 1A and in the second embodiment the test key subcircuit 165 generates a signal to control the configuration of the oscillator circuit 60 of FIG. 2A.

The test key subcircuit 170 is enabled when RAKEY* is high, when SAKEY* and the super voltage logic signal (SUPERV*) are low, when CA4 and CA5* are low, and when KA0 is high. When the test key subcircuit 170 is enabled latch circuitry 180 latches an active test signal at the control node 190 of the multiplexer circuit 15 of FIG. 1A, thereby selecting the signal at node 35 as the internal RAS control signal. The subcircuit 170 is disabled during normal operation, and an inactive test signal is latched to the control node 190 of the multiplexer circuit 15 of FIG. 1A thereby selecting the signal at node 45 as the internal RAS control signal.

Thus the invention ensures that parts which pass the test mode have good guardband with respect to the lockout circuit pulse widths and provides good production feedback. For example, "lots" of DRAMs that have a high row line resistance will be susceptible to a shorter tRP pulse width. The test mode of the invention weeds out parts that are on the verge of failing due to the lock-outs being too "tight". It will also give feedback as to where the lockout delays should be adjusted and if there are defective delay elements in the lockout circuits.

The test key subcircuit 165 is enabled when RAKEY* is high, when SAKEY* and SUPERV* are low, when CA4* and CA5 are low, and when KA0 is high. When the test key subcircuit 165 is enabled latch circuitry 185 latches an active test signal at the control input 195 of transistor 80 in FIG. 2B thereby increasing the total capacitance of the oscillator circuit. The increased capacitance causes the oscillator frequency to decrease which, in turn, causes the self-refresh period to increase in the test mode, thereby stressing the part in the test mode. When the test key subcircuit 165 is disabled during normal operation an inactive test signal is latched at control input 195 isolating capacitor 85 from capacitor 90 and decreasing the total capacitance of the oscillator circuit from the total capacitance present during the test mode.

Since the self-refresh period is greater during the test mode there is more time for the storage capacitor of the DRAM to discharge, and the DRAM is stressed. DRAMs passing tests performed while being stressed as described above have good guardband. If the part passes the test mode it automatically has added margin. The percentage of added margin can be closely controlled and no longer relies on taking into account all variables, such as temperature, transistor characteristics, and defects. Test programs in the back end can be simplified because they don't have to cover a range of values or bin out parts to different self-refresh values. In fact the part must only be tested for current draw and functionality in self-refresh.

Figure 5:
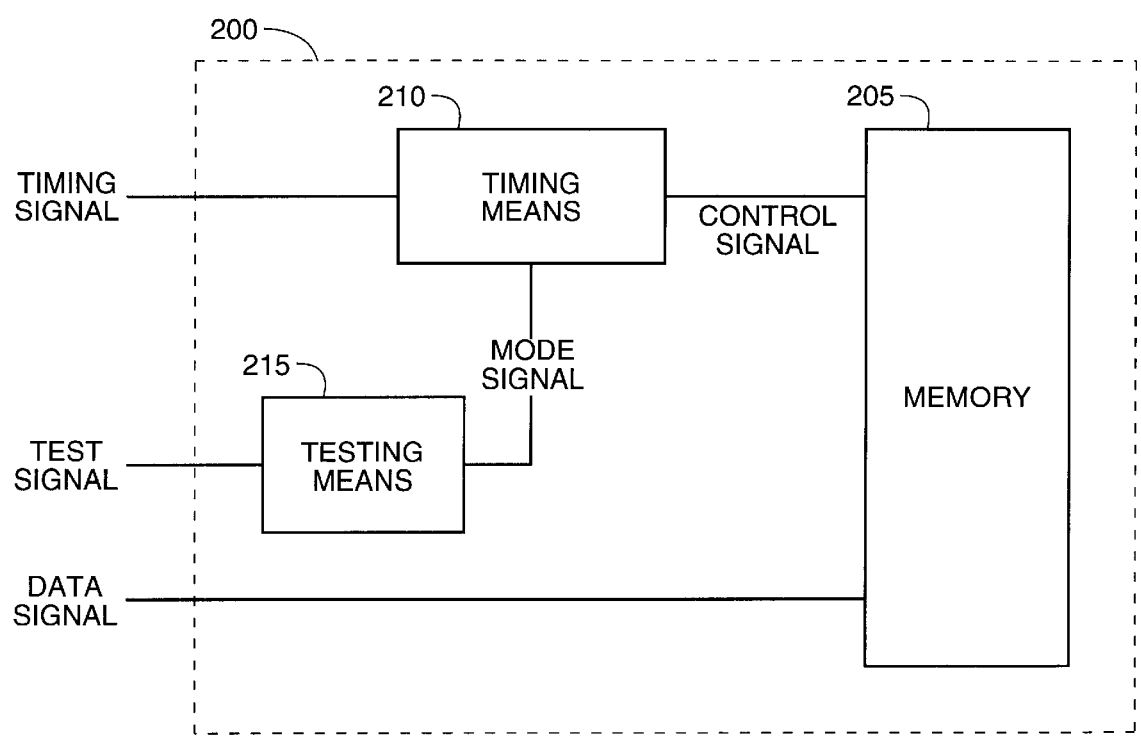
FIG. 5 is a block schematic comprising portions of the monolithic chip of the invention.

FIG. 5 is block schematic of a monolithic chip 200 of the invention. The monolithic chip 200 receives at least 3 signals, a timing signal, a test signal, and a data signal. A memory 205 stores data in response to the data signal. A timing means 210 generates a control signal in response to the timing signal. A testing means 215 generates a mode signal in response to the test signal. The mode signal has a first value during normal operation and a second value during a test mode. The mode signal controls the pulse width of a pulse of the control signal in a first embodiment of the invention and controls a period of the control signal in a second embodiment of the invention. By internally varying the pulse width or period of the control signal in response to the mode signal, the memory can be stressed during test.

It has been shown that the invention provides efficient testing of encapsulated DRAMS by controlling the pulse width and periods of internal control signals. The invention not only saves valuable manufacturing time but also reduces costs and provides reliable testing of the manufactured DRAM.

The invention uses various materials which are electrically either conductive, insulative, or semiconductive, although the completed semiconductor circuit device itself is usually referred to as a "semiconductor."

Where electrical functions and connections are described, it is understood that it is possible, within the scope of this invention, to use equivalent circuits to perform the described functions. As an example, a transistor can be used as a diode or resistor. Likewise, two electrical components which are connected may have interceding components which physically separate the two components. "Connected" is therefore intended to include components which are in electrical communication despite intervening components.

Although the invention has been described in terms of a test key circuit used to vary a pulse width of a pulse generated by a lock out circuit and to vary a period of a self-refresh signal, it is possible, within the scope of the invention, to have an electronic test key which varies pulse widths andor periods of other control signals during a test mode. And although the invention has been described in terms of a DRAM, the circuit and method have utility in other circuits where testing of the circuit can be performed more efficiently by using internal circuitry to vary pulse widths, periods, and frequencies of internal control signals. Accordingly the invention should be read as limited only by the claims.

What is claimed is:

1. A memory device for storing data, comprising:
    an internal control circuit configured to generate an internal control signal having a first period during a normal operating mode and a second period during a test mode; and
    an internal test key circuit in electrical communication with said internal control circuit, said internal test key circuit configured to provide a test key signal, having a first state and a second state, to said internal control circuit, said internal control circuit configured to respond to said first state of said test key signal to generate said second period of said internal control signal, wherein said first and second periods are different.

2. The memory device as specified in claim 1, wherein said second period is larger than said first period.

3. The memory device as specified in claim 1, wherein said internal control circuit comprises:
    an oscillator circuit configured to generate an oscillator signal having a frequency; and
    a counter circuit configured to count oscillations of said oscillator signal and to generate said internal control signal in response to said frequency of said oscillator signal.

4. The memory device as specified in claim 3, wherein said oscillator circuit comprises:
    a primary portion; and
    a secondary portion isolated from said primary portion during the normal operating mode in response to said test key signal having said second state, said secondary portion coupled to said primary portion during said test mode in response to said test key signal having said first state.

5. The memory device as specified in claim 4, wherein said oscillator circuit further comprises a switching device in electrical communication with said secondary portion, said switching device responsive to said test key signal to be activated during said test mode and inactivated during said normal operating mode.

6. The memory device as specified in claim 5, wherein said primary portion and said secondary portion are connected in parallel by said switching device during the test mode.

7. The memory device as specified in claim 5, wherein said internal test key circuit comprises a latch circuit configured to latch said test key signal to said switching device.

8. The memory device as specified in claim 1, wherein said internal test key circuit is configured to respond to an external test signal.

9. The memory device as specified in claim 3, wherein said frequency of said oscillator signal is less during the test mode than during the normal operating mode.

10. The memory device as specified in claim 3, wherein said oscillator circuit has a capacitance which is greater during the test mode than during the normal operating mode.

11. A memory device comprising:
    a plurality of memory cells;
    a first control circuit coupled to the memory cells to generate a periodic control signal having a first period in a first mode of operation and a second period in a second mode of operation; and
    a second control circuit coupled to the first control circuit to generate a mode signal to cause the first control circuit to select the first mode of operation or the second mode of operation.

12. The memoir device of claim 11 wherein:
    the first mode of operation comprises a normal mode and the second mode of operation comprises a test mode;
    the memory device comprises a monolithic dynamic random access memory device comprising:
        a matrix of intersecting rows and columns of the memory cells; and
        external address input pins to receive address signals;
    the first control circuit comprises:
        an oscillator circuit comprising:
            a first capacitor coupled between a reference voltage and an output of the oscillator circuit;
            a second capacitor coupled a transistor, the transistor having a control terminal coupled to receive the mode signal from the second control circuit to decouple the second capacitor from the first capacitor in the normal mode and to couple the second capacitor in parallel with the first capacitor between the reference voltage and the output of the oscillator circuit in the test mode; and
            a current source and the reference voltage being coupled to the output of the oscillator circuit through a plurality of transistors to charge and discharge the first capacitor and the second capacitor according to a voltage at the output of the oscillator circuit and a self-refresh signal;
        a counter circuit coupled to the output of the oscillator circuit to generate the periodic control signal having a period during which the counter counts the voltage at the output of the oscillator circuit rising to a threshold level a selected number of times, the first period being the period in the normal mode and the second period being the period in the test mode that is longer than the first period;
        a refresh circuit coupled between the counter circuit and the matrix of memory cells to receive the periodic control signal and to refresh the memory cells within the period of the periodic control signal to restore voltages in the memory cells; and
    the second control circuit comprises a test key circuit comprising:
        a first input coupled to receive a super voltage logic signal;
        a second input coupled to receive a reset test key signal and a third input coupled to receive a set test key signal;

a plurality of further inputs coupled to the address input pins; and a logic circuit coupled to receive the super voltage logic signal, the reset test key signal, the set test key signal, and the address signals to generate the mode signal in response to the super voltage logic signal, the reset test key signal, the set test key signal, and the address signals.

13. A memory device comprising:

a plurality of memory cells;

an operational circuit coupled to the memory cells;

a first control circuit coupled to the operational circuit to generate a periodic control signal having a first period in a first mode of operation and a second period in a second mode of operation, the periodic control signal causing the operational circuit to act on the memory cells; and a second control circuit coupled to the first control circuit to generate a mode signal to cause the first control circuit to select the first mode of operation or the second mode of operation.

14. The memory device of claim 13 wherein:

the first mode of operation comprises a normal mode and the second mode of operation comprises a test mode;

the memory device comprises a monolithic dynamic random access memory device comprising:
  a matrix of intersecting rows and columns of the memory cells; and
  external address input pins to receive address signals;

the first control circuit comprises:
  an oscillator circuit comprising:
    a first capacitor coupled between a reference voltage and an output of the oscillator circuit;
    a second capacitor coupled a transistor, the transistor having a control terminal coupled to receive the mode signal from the second control circuit to decouple the second capacitor from the first capacitor in the normal mode and to couple the second capacitor in parallel with the first capacitor between the reference voltage and the output of the oscillator circuit in the test mode; and
    a current source and the reference voltage being coupled to the output of the oscillator circuit through a plurality of transistors to charge and discharge the first capacitor and the second capacitor according to a voltage at the output of the oscillator circuit and a self-refresh signal;
  a counter circuit coupled to the output of the oscillator circuit to generate the periodic control signal having a period during which the counter counts the voltage at the output of the oscillator circuit rising to a threshold level a selected number of times, the first period being the period in the normal mode and the second period being the period in the test mode that is longer than the first period;

the operational circuit comprises a refresh circuit coupled between the counter circuit and the matrix of memory cells to receive the periodic control signal and to refresh the memory cells within the period of the periodic control signal to restore voltages in the memory cells; and the second control circuit comprises a test key circuit comprising:
  a first input coupled to receive a super voltage logic signal;
  a second input coupled to receive a reset test key signal and a third input coupled to receive a set test key signal;

a plurality of further inputs coupled to the address input pins; and a logic circuit coupled to receive the super voltage logic signal, the reset test key signal, the set test key signal, and the address signals to generate the mode signal in response to the super voltage logic signal, the reset test key signal, the set test key signal, and the address signals.

15. A memory device comprising:

a plurality of memory cells;

a first control circuit to generate a periodic control signal having a first period in a normal mode of operation and a second period in a test mode of operation;

a second control circuit coupled to the first control circuit to generate a mode signal to cause the first control circuit to select the normal mode of operation or the test mode of operation; and a refresh circuit coupled between the first control circuit and the memory cells to receive the periodic control signal and to refresh the memory cells within the first period during the normal mode of operation and within the second period during the test mode of operation to restore voltages in the memory cells.

16. The memory device of claim 15 wherein:

the memory device comprises a monolithic dynamic random access memory device comprising:
  a matrix of intersecting rows and columns of the memory cells; and
  external address input pins to receive address signals;

the first control circuit comprises:
  an oscillator circuit comprising:
    a first capacitor coupled between a reference voltage and an output of the oscillator circuit;
    a second capacitor coupled a transistor, the transistor having a control terminal coupled to receive the mode signal from the second control circuit to decouple the second capacitor from the first capacitor in the normal mode of operation and to couple the second capacitor in parallel with the first capacitor between the reference voltage and the output of the oscillator circuit in the test mode of operation; and
    a current source and the reference voltage being coupled to the output of the oscillator circuit through a plurality of transistors to charge and discharge the first capacitor and the second capacitor according to a voltage at the output of the oscillator circuit and a self-refresh signal;
  a counter circuit coupled to the output of the oscillator circuit to generate the periodic control signal having a period during which the counter counts the voltage at the output of the oscillator circuit rising to a threshold level a selected number of times, the first period being the period in the normal mode of operation and the second period being the period in the test mode of operation that is longer than the first period;

the refresh circuit is coupled between the counter circuit and the memory cells; and the second control circuit comprises a test key circuit comprising:
  a first input coupled to receive a super voltage logic signal;
  a second input coupled to receive a reset test key signal and a third input coupled to receive a set test key signal;

a plurality of further inputs coupled to the address input pins; and a logic circuit coupled to receive the super voltage logic signal, the reset test key signal, the set test key signal, and the address signals to generate the mode signal in response to the super voltage logic signal, the reset test key signal, the set test key signal, and the address signals.

17. A memory device comprising:

a plurality of memory cells;

address input pins to receive address signals;

a lockout circuit; and means for refreshing the memory cells within a first period during a normal mode of operation and within a second period during a test mode of operation to restore voltages in the memory cells.

18. A method of operating a memory device comprising:

generating a periodic control signal having a first period in a first mode of operation of a memory device and a second period in a second mode of operation of the memory device;

generating a mode signal to select the first mode of operation or the second mode of operation; and acting on a plurality of memory cells in the memory device in response to the periodic control signal.

19. The method of claim 18 wherein:

generating a periodic control signal further comprises:

charging a first capacitor from a current source until an output voltage of the first capacitor rises to a threshold level, the first capacitor being charged in a normal mode and in a test mode in response to a self-refresh signal;

discharging the first capacitor after the output voltage has risen to the threshold level;

coupling a second capacitor in parallel with the first capacitor in the test mode through a transistor controlled by the mode signal;

charging the first capacitor and the second capacitor from the current source until the output voltage of the first capacitor coupled in parallel with the second capacitor rises to the threshold level;

discharging the first capacitor and the second capacitor after the output voltage has risen to the threshold level;

counting each time the output voltage rises to the threshold level; and generating the periodic control signal having a period during which the output voltage rises to the threshold level a selected number of times, the first period being the period in the normal mode and the second period being the period in the test mode that is longer than the first period;

acting on a plurality of memory cells further comprises refreshing memory cells in a monolithic dynamic random access memory device during, the period of the periodic control signal to restore voltages in the memory cells; and generating a mode signal further comprises generating the mode signal in a logic circuit in response to address signals, a super voltage logic signal, a reset test key signal, and a set test key signal coupled to the memory device.

20. A method of operating a memory device comprising:

generating a periodic control signal having a first period in a normal mode of operation of a memory device and a second period in a test mode of operation of the memory device;

generating a mode signal to select the normal mode of operation or the test mode of operation; and refreshing a plurality of memory cells in the memory device within the first period during the normal mode of operation and within the second period during the test mode of operation to restore voltages in the memory cells.

21. The method of claim 20 wherein:

generating a periodic control signal further comprises:

charging a first capacitor from a current source until an output voltage of the first capacitor rises to a threshold level, the first capacitor being charged in the normal mode of operation and in the test mode of operation in response to a self-refresh signal;

discharging the first capacitor after the output voltage has risen to the threshold level;

coupling a second capacitor in parallel with the first capacitor in the test mode of operation through a transistor controlled by the mode signal;

charging the first capacitor and the second capacitor from the current source until the output voltage of the first capacitor coupled in parallel with the second capacitor rises to the threshold level;

discharging the first capacitor and the second capacitor after the output voltage has risen to the threshold level;

counting each time the output voltage rises to the threshold level; and generating the periodic control signal having, a period during which the output voltage rises to the threshold level a selected number of times, the first period being the period in the normal mode of operation and the second period being the period in the test mode of operation that is longer than the first period;

refreshing a plurality of memory cells further comprises refreshing a plurality of memory cells in a monolithic dynamic random access memory device; and generating a mode signal further comprises generating the mode signal in a logic circuit in response to address signals, a super voltage logic signal, a reset test key signal, and a set test key signal coupled to the memory device.

* * * * *

UNITED STATES PATENT AND TRADEMARK OFFICE
CERTIFICATE OF CORRECTION

PATENT NO. : 6,529,426 B1
DATED : March 4, 2003
INVENTOR(S) : Paul S. Zagar and Todd A. Merritt It is certified that error appears in the above-identified patent and that said Letters Patent is hereby corrected as shown below:

Title Page,
Item [75], Inventors, delete "Boise, ID" after "Zagar" and insert -- Woodinville, WA -- therefor.
Item [56], References Cited, U.S. PATENT DOCUMENTS, delete "4,139,848" and insert -- 4,139,818 -- therefor;
OTHER PUBLICATIONS, "Merritt, Todd et al.," reference, delete "Todd.,et al. ," and insert -- Todd., et al., -- therefor; and delete "1996,." and insert -- 1996. -- therefor; "Protopapas, D..A. ," reference, delete "D..A.," and insert -- D.A., -- therefor.

Column 4,
Line 15, insert a new paragraph beginning with -- The test key circuit 20... --

Column 7,
Line 15, delete "andor" and insert -- and\or -- therefor.

Column 11,
Line 57, delete "," after "during".

Signed and Sealed this

First Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,529,426 B1  
DATED : March 4, 2003  
INVENTOR(S) : Todd A. Merritt et al.

Page 1 of 1

It is certified that error appears in the above-identified patent and that said Letters Patent is hereby corrected as shown below:

<u>Title Page,</u>
Item [75], Inventors, after "Zagar" -- Boise, ID -- (as deleted by Certificate of Correction issued June 1, 2004) should be reinstated.

Signed and Sealed this

Tenth Day of August, 2004

JON W. DUDAS
*Acting Director of the United States Patent and Trademark Office*